United States Patent [19]

Itoi

[11] Patent Number: 5,770,930
[45] Date of Patent: Jun. 23, 1998

[54] VERTICAL DEFLECTING CIRCUIT USING A RAISED SOURCE VOLTAGE

[75] Inventor: Nobuo Itoi, Oizumi-machi, Japan

[73] Assignee: Sanyo Electric Co., Ltd., Osaka, Japan

[21] Appl. No.: 791,286

[22] Filed: Jan. 30, 1997

[30] Foreign Application Priority Data

Feb. 9, 1996 [JP] Japan .................................. 8-024253

[51] Int. Cl.[6] ...................................................... G09G 1/04
[52] U.S. Cl. ............................................................ 315/403
[58] Field of Search .................................. 315/403, 411, 315/406

[56] References Cited

U.S. PATENT DOCUMENTS

| | | | |
|---|---|---|---|
| 3,784,857 | 1/1974 | Christopher | 315/403 |
| 3,969,653 | 7/1976 | Fukaya | 315/403 |
| 4,184,106 | 1/1980 | Schaas | 315/403 |
| 4,293,803 | 10/1981 | Fitzgerald | 315/403 |

*Primary Examiner*—Gregory C. Issing
*Attorney, Agent, or Firm*—Loeb & Loeb LLP

[57] ABSTRACT

A vertical deflecting circuit comprises a vertical output circuit (12) which amplifies an input sawtooth wave signal and supplies a deflection current to a vertical deflection coil (13), a power source (14) which applies a source voltage to the vertical output circuit, a first pump-up circuit (17) which raises the voltage from the power source, and a second pump-up circuit (18) which further raises the output voltage from the first pump-up circuit. In a fly-back time of a vertical output signal, the vertical output circuit is operated by the voltage from the second pump-up circuit, and the vertical output circuit is operated by the voltage from the power source during a time coefficient.

8 Claims, 7 Drawing Sheets

Fig. 1 PRIOR ART

PRIOR ART

VERTICAL DEFLECTING CIRCUIT USING A RAISED SOURCE VOLTAGE

BACKGROUND OF THE INVENTION

1. Field of the Invention

The invention relates to a vertical deflecting circuit, and more particularly to a vertical deflecting circuit which is suitably formed into an integrated circuit (IC).

2. Description of the Related Art

Figure 1:
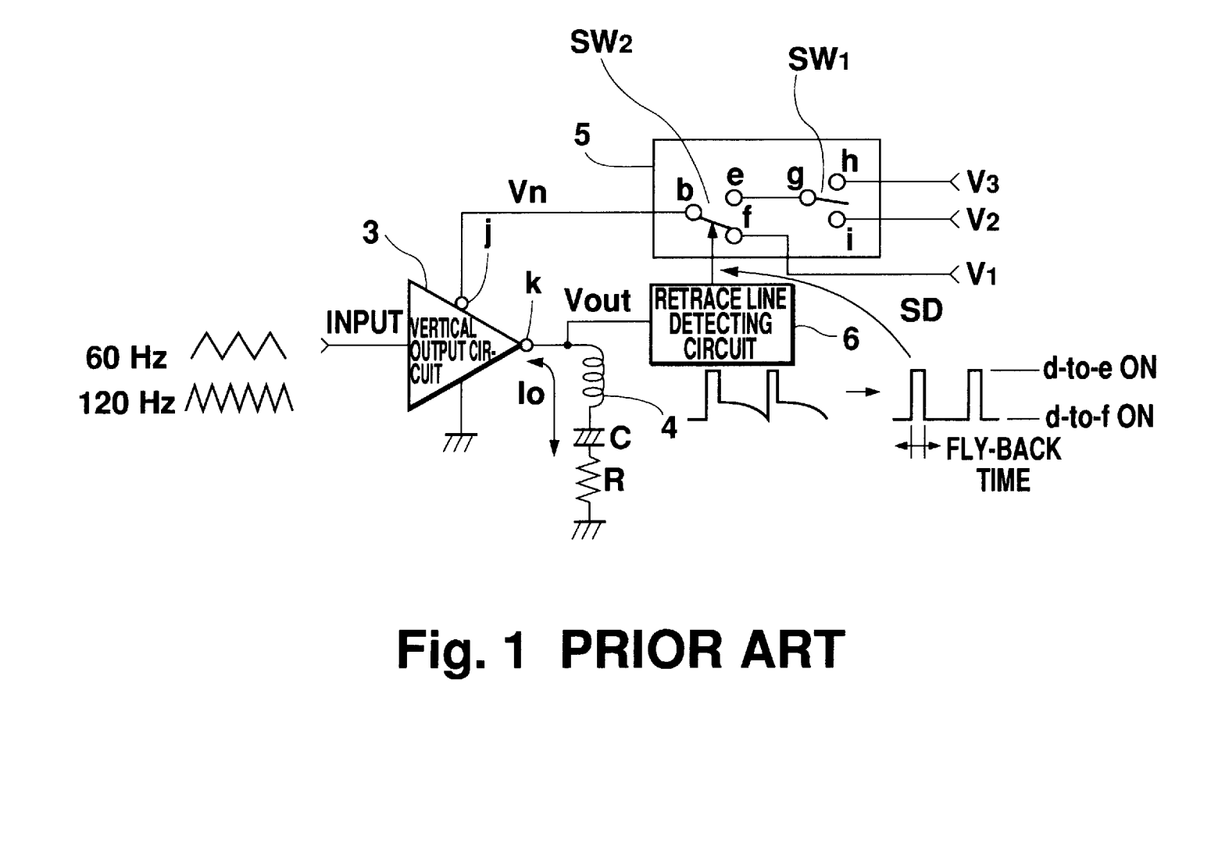
FIG. 1 is a circuit diagram showing a conventional vertical deflecting circuit.

In a vertical deflecting circuit, a vertical deflection current I0 is supplied to a vertical deflection coil 4 as shown in FIG. 1. According to the vertical deflection current I0, a cathode-ray tube is vertically deflected. The vertical deflection current has a scanning interval and a fly-back time. In the scanning interval, the current flows toward a capacitor C in its first half and flows from the capacitor C in its second half. Conversely, in the fly-back time, the current flows from the capacitor C in the first half and flows toward the capacitor C in the second half. The duration of the fly-back time is determined by the source voltage +VCC (=Vn in FIG. 1) of a vertical output circuit 3, the inductance and direct current resistance component of the vertical deflection coil 4, and the vertical deflection current I0 shown in FIG. 1.

Figures 2A, 2B, 2C:
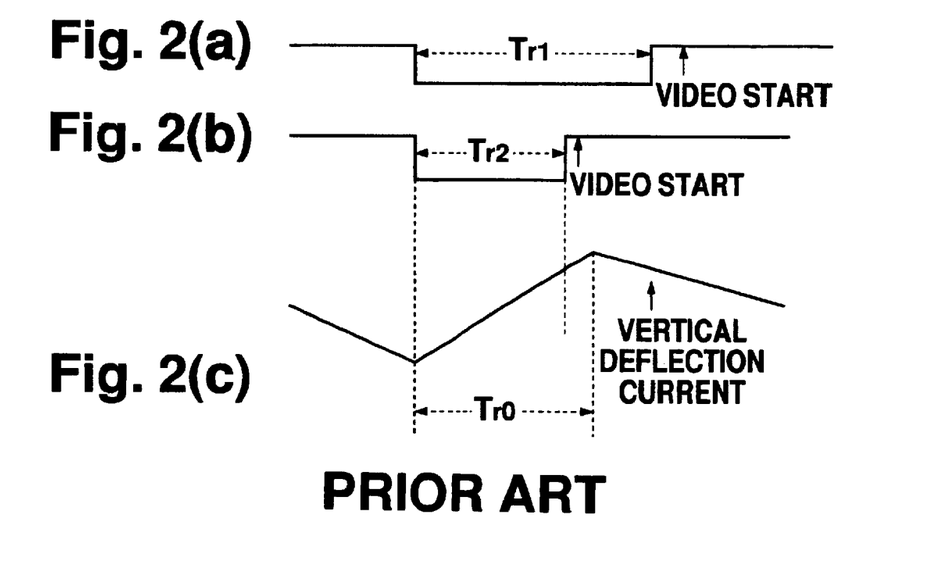

For a TV set which displays TV broadcasting signals only, the fly-back time is completed before the start of video. FIG. 2 (a) shows a vertical synchronizing signal of the TV broadcasting signals, and FIG. 2 (c) shows a fly-back time determined by the TV set. There is no problem, if the relationship between the vertical synchronizing signal and the fly-back time is as shown in FIG. 2 (a) and FIG. 2 (c).

However, when a TV set which receives a signal from a computer receives a vertical synchronizing signal shown in FIG. 2 (b), a phenomenon known as "aliasing" takes place. The vertical synchronizing signal of FIG. 2 (b) is contained in a picture signal of a personal computer or the like and has a narrow vertical synchronizing pulse width, and video starts quickly. Also, video starts within the fly-back time.

Figure 3:
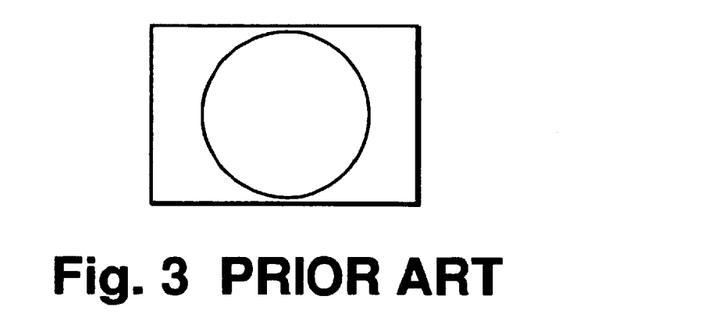
FIG. 3 is a diagram describing the characteristics of a conventional circuit.
Figure 4:
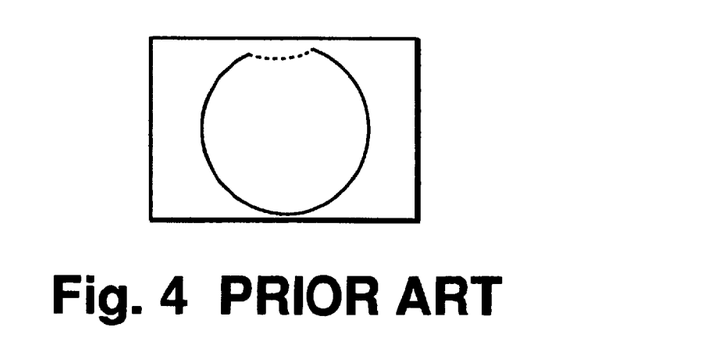
FIG. 4 is a diagram describing the characteristics of a conventional circuit.

Accordingly, a circle which should be shown on a TV screen as shown in FIG. 3 is displayed as shown in FIG. 4. This phenomenon is caused because video is started within the fly-back time.

Figure 5:
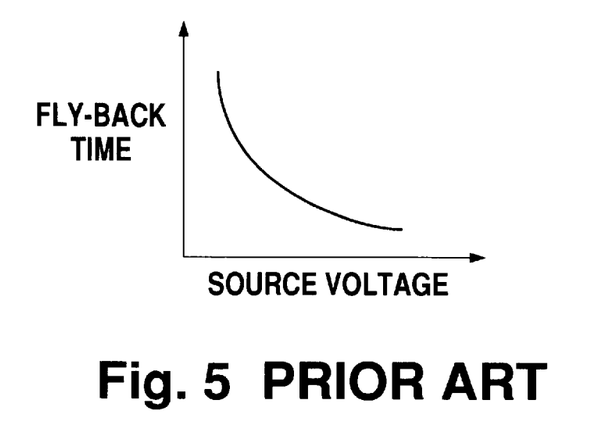
FIG. 5 is a diagram describing the characteristics of a conventional circuit.

For a monitor to which a picture signal from a personal computer is applied in addition to TV broadcasting signals, it is necessary to vary the fly-back time or to previously decrease the fly-back time according to the types of signals received. As a simple method of varying the fly-back time, the source voltage of the vertical output circuit 3 shown in FIG. 1 is raised. FIG. 5 shows a relationship between the source voltage and the fly-back time of the vertical output circuit 3.

However, in such a simple method, the original source voltage value which has been set to an appropriate level for the signal during the scanning interval in view of a dynamic range is raised, leading to wasted consumption of power and increased heat generation. To remedy the increased heat generation, it is necessary to enlarge a heat sink.

Therefore, it is proposed to raise the source voltage during the fly-back time of the entered vertical synchronizing signal and also to enable the adjustment of a raising amount. FIG. 1 shows such a vertical deflecting circuit, in which vertical synchronizing signals of 60 Hz and 120 Hz are applied to the vertical output circuit 3. A power source V1 in FIG. 1 is set to a low voltage suitable for the scanning interval. A power source V2 is set to a voltage suitable for the fly-back time of the vertical synchronizing signal of 60 Hz. Lastly, a power source V3 is set to a voltage suitable for the fly-back time of the vertical synchronizing signal of 120 Hz. SW1 is switched to "i" upon detecting to receive the vertical synchronizing signal of 60 Hz or to "h" upon detecting to receive the vertical synchronizing signal of 120 Hz. SW2 is switched to "e" during the fly-back time and to "f" during the scanning interval.

When the vertical synchronizing signal of 60 Hz is applied to the vertical output circuit 3, the vertical deflection current I0 flows through the vertical deflection coil 4.

On the other hand, SW1 is switched to the side of V2 upon detecting to receive the vertical synchronizing signal of 60 Hz. A retrace line detecting circuit 6 operates to flip SW2 to "e" during the fly-back time and to "f" during the scanning interval. Therefore, the optimum voltage Vn is applied from a source circuit 5 to the vertical output circuit 3.

Then, when the vertical synchronizing signal of 120 Hz is applied to the vertical output circuit 3, SW1 is switched to "h", and SW2 operates in the same way as described above. At this time, the highest voltage from the power source V3 is applied, and the fly-back time becomes shortest.

Therefore, the circuit shown in FIG. 1 can obtain the optimum fly-back time even when any type of vertical synchronizing signal is received.

However, the circuit shown in FIG. 1 has a disadvantage that the source circuit 5 needs a plurality of power sources. Generally, the vertical output circuit 3 is formed in an IC excepting the vertical deflection coil 4 and the like. Further, to provide a voltage equal to or above the source voltage of the IC, it is necessary to provide a plurality of power sources outside the IC, but when the plurality of power sources are provided, the number of parts are increased, and the product cost is also increased. Particularly, when various types of vertical synchronizing signals come in, a source voltage suitable for each of them is required, increasing the number of power sources.

SUMMARY OF THE INVENTION

The present invention aims to provide a vertical deflecting circuit by which a raised source voltage can be obtained from a single source voltage.

According to the invention, the raised source voltage can be obtained by a charging pump circuit. A source voltage for a vertical output circuit can be raised by the raised source voltage, so that a fly-back time of a vertical output signal can be shortened.

For example, a pump-up voltage three times higher than a single power source for an IC can be produced. This voltage can be used to shorten the fly-back time. Accordingly, video can be prevented from being contained in the fly-back time even when a vertical synchronizing signal comes in from a personal computer or the like. Further, since the voltage of a single power source can be raised, it is not necessary to provide a plurality of power sources outside, e.g., an IC, and the number of parts can be decreased.

Since the raised source voltage can be varied, it is easy to set various vertical fly-back times.

Furthermore, a charging pump circuit is configured of a circuit having two capacitors, and the two capacitors are charged and the raised voltage is outputted at the same time, so that the circuit is made simple.

BRIEF DESCRIPTION OF THE DRAWINGS

FIG. 2 (a), FIG. 2 (b) and FIG. 2 (c) are waveform diagrams describing the characteristics of conventional circuits.

FIG. 10 (a), FIG. 10 (b), FIG. 10 (c) and FIG. 10 (d) are waveform diagrams describing the operation of a charging pump circuit according to the invention.

DETAILED DESCRIPTION OF THE PREFERRED EMBODIMENTS

Figure 6:
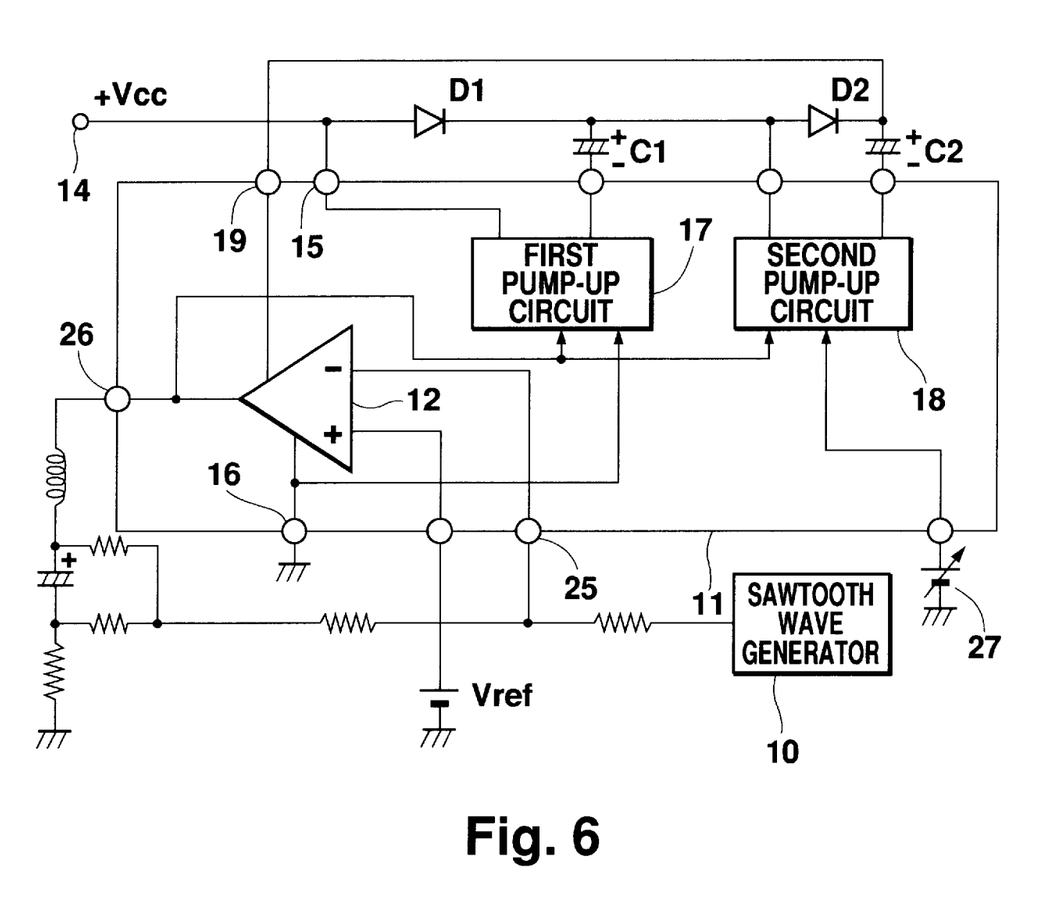
FIG. 6 is a circuit diagram showing a vertical deflecting circuit according to the invention.

FIG. 6 shows a vertical deflecting circuit according to the invention, in which reference numeral 10 denotes a sawtooth wave generator which generates a sawtooth wave in accordance with a vertical synchronizing signal, 11 an IC, 12 a vertical output circuit which amplifies an entered sawtooth wave signal and supplies a deflection current to a vertical deflection coil 13, 14 a power source terminal which applies a source voltage +VCC to the IC 11 via a pin 15, 16 a pin for grounding the IC 11, 17 a first pump-up circuit which doubles the voltage from the power terminal 14, and 18 a second pump-up circuit which further raises the output voltage from the first pump-up circuit 17 and applies it as the power to the vertical output circuit 12. The vertical output circuit 12 is powered by the raised voltage from a pin 19 during a fly-back time and powered by the non-raised voltage from the pin 19 via diodes D1, D2 during a scanning interval.

In FIG. 6, a single power source is used, but two power sources of positive and negative type may be used.

Figure 7:
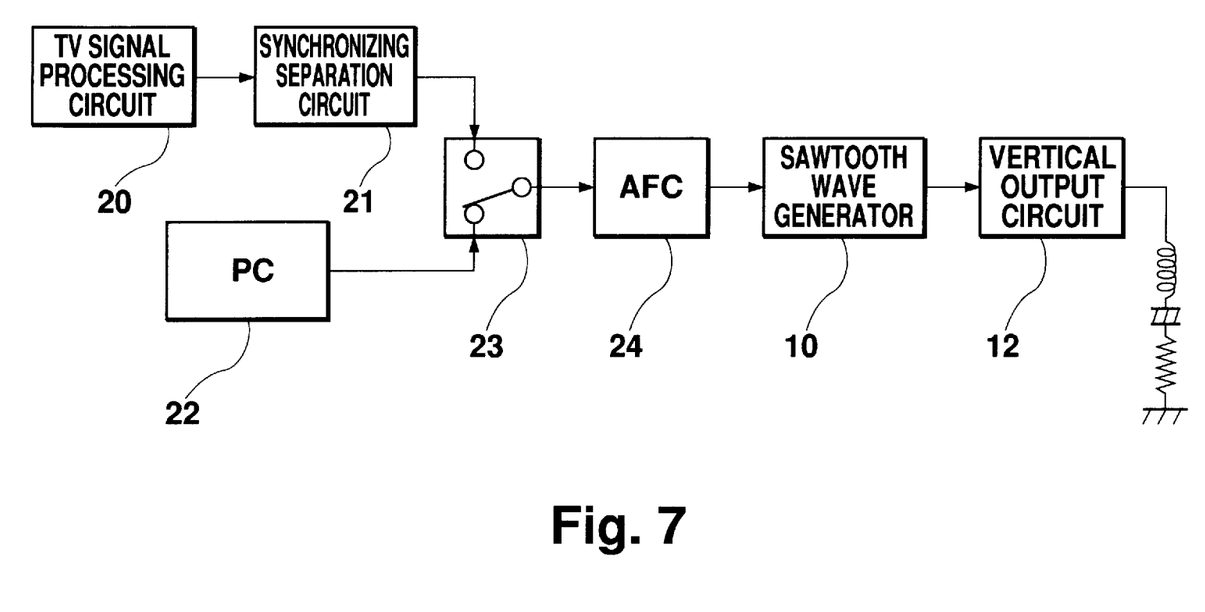
FIG. 7 is a diagram showing the entire system of a vertical deflecting circuit according to the invention.

A signal is applied from a circuit shown in FIG. 7 to the sawtooth wave generator 10 shown in FIG. 6. Specifically, a TV broadcasting signal is generated from a TV signal processing circuit 20, and a vertical synchronizing signal is synchronously separated from the TV broadcasting signal by a synchronizing separation circuit 21. A vertical synchronizing signal is also generated from a personal computer (PC) 22 and applied to a switch 23. The vertical synchronizing signal selected by the switch 23 is applied to an automatic frequency control (AFT) circuit 24. Also, a sawtooth wave is generated from a sawtooth generator 10 according to an output signal from the AFC circuit 24. In other words, by controlling the charging and discharging of a capacitor, the sawtooth wave having the same frequency as the output signal from the AFC circuit 24 is generated.

Figure 8:
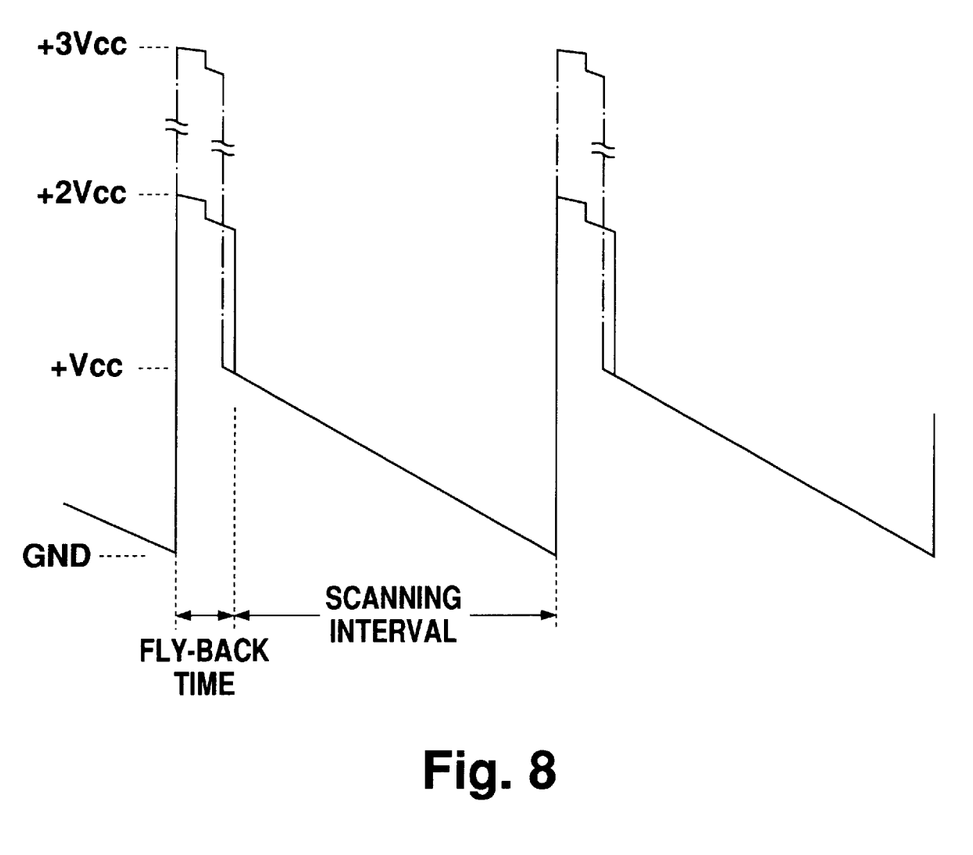
FIG. 8 is a waveform diagram describing the characteristics of a circuit according to the invention.

Therefore, the sawtooth wave generated from the sawtooth wave generator 10 shown in FIG. 6 has various types of frequencies. The sawtooth wave is applied to a negative input terminal (−) of the vertical output circuit 12 via the pin 25. A given reference voltage Vref is supplied to a positive input terminal (+) of the vertical output circuit 12. Thus, a deflecting current is supplied from the vertical output circuit 12 to the vertical deflection coil 13, and a vertical output signal shown in FIG. 8 is generated at the pin 26. The vertical output signal then returns to the pin 25.

Now, descriptions will be made of the operation of raising the voltage during the fly-back time by the pump-up circuits. In the circuit shown in FIG. 6, the pump-up circuits which are formed in the IC supply a voltage three times higher than the source voltage to the vertical output circuit 12 during the fly-back time, but the source voltage not raised is supplied via the diodes D1, D2 during the scanning interval.

In other words, it is controlled to provide a vertical output signal having a waveform as indicated by a dash and doted line in FIG. 8. A solid line indicating the fly-back time in FIG. 8 shows that the voltage is doubled, suggesting that the fly-back time is further decreased by raising the voltage from two times to three times.

Capacitors C1, C2 of the first pump-up circuit 17 and the second pump-up circuit 18 are charged by the voltage +VCC from the power terminal 14 during the scanning interval. When a change to the fly-back time is detected in view of the vertical output signal from the pin 26, the first pump-up circuit 17 generates a voltage 2 VCC on the + side of the capacitor C1, and the second pump-up circuit 18 generates a voltage 3 VCC on the + side of the second pump-up circuit 18.

Therefore, the vertical output circuit 12 operates with the voltage 3 VCC during the fly-back time and with the voltage VCC during the scanning interval.

Since various vertical synchronizing signals are generated from the PC 22 shown in FIG. 7, the pump-up voltage (voltage rising) is preferably variable depending on the types of vertical synchronizing signals in view of electrical efficiency. Accordingly, the output voltage from the second pump-up circuit 18 is made variable between two times and three times in the present invention. Thus, an optimum fly-back time can be provided. Specifically, the optimum fly-back time is obtained by lowering the charging voltage of the capacitor C2 of the second pump-up circuit 18 from a level of three times by a variable power source 27.

Figure 9:
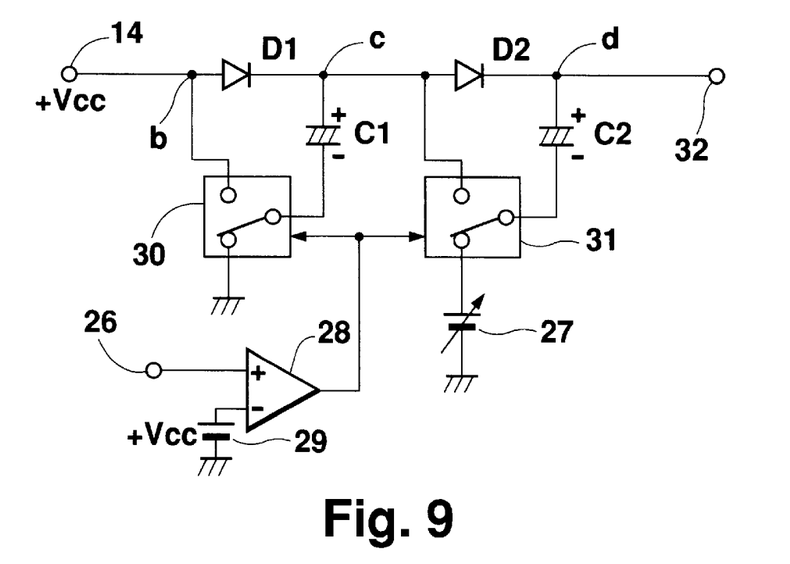
FIG. 9 is a circuit diagram showing the configuration of a charging pump circuit according to the invention.
Figure 10A:
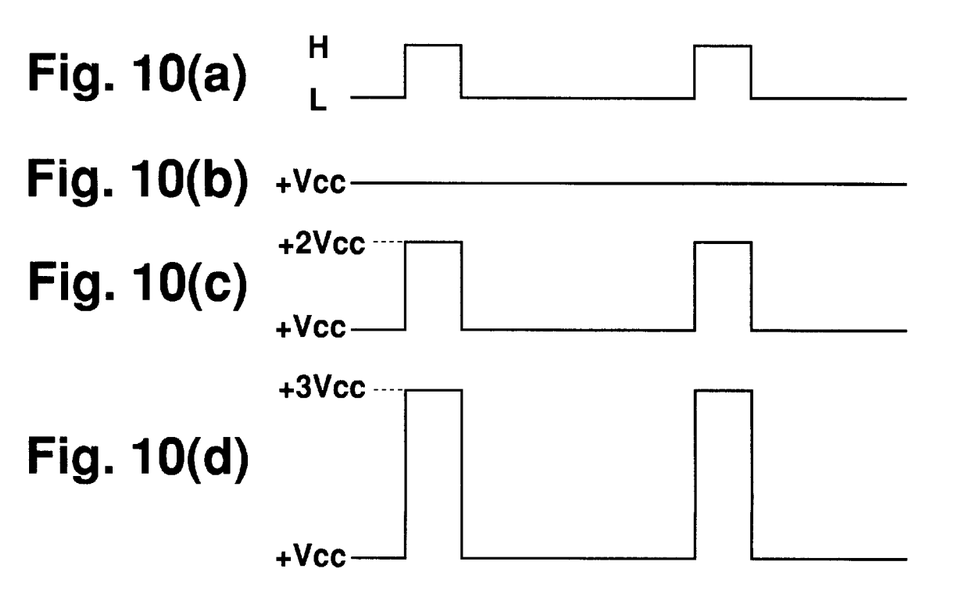

FIG. 9 shows a specific example of the first pump-up circuit 17 and the second pump-up circuit 18 shown in FIG. 6. The vertical output signal waveform of FIG. 6 is generated at a pin 26 in FIG. 9. A standard power source 29 for a comparator 28 is set at a voltage +VCC. Accordingly, an "H" level signal is generated when a vertical fly-back pulse (FBP) generated during the fly-back time is coming in, and an "L" level signal is generated during the scanning interval. FIG. 10 (a) shows the output signal from the comparator 28, and FIG. 10 (b) shows the voltage at a point b.

When it is assumed that the signal is at the "L" level during the scanning interval, switches 30, 31 are in the state as shown in FIG. 9. Then, the diodes D1, D2 are conducted by the voltage +VCC from the power terminal 14, and the capacitors C1, C2 are charged with the voltage +VCC. Meanwhile, the variable power source 27 is determined to have no voltage.

In the fly-back time with the switches 30, 31 flipped to a state opposite from the state shown in FIG. 9, a point c in FIG. 9 has a voltage shown in FIG. 10 (c), and a point d in FIG. 9 has a voltage shown in FIG. 10 (d).

Thus, a voltage +3 VCC is generated at an output terminal 32 in FIG. 9.

It is assumed that the variable power source 27 in FIG. 9 has a voltage +VCC/2. Then, the capacitor C2 has a charging voltage +VCC/2. As a result, a voltage +2.5 VCC is generated at the output terminal 32 in FIG. 9. Thus, when the variable power source 27 is controlled to have a different value, the voltage at the output terminal 32 is changed, and the pump-up voltage can be lowered to a desired value. In other words, the waveform (voltage +3 VCC) indicated by the dash and doted line in FIG. 8 can be changed as desired to the waveform (voltage +2 VCC) indicated by the solid line.

While there have been described what are at present considered to be preferred embodiments of the invention, it is to be understood that various modifications may be made thereto, and it is intended that the appended claims cover all such modifications as fall within the true spirit and scope of the invention.

What is claimed is:

1. A vertical deflecting circuit which uses a raised source voltage obtained by raising a standard source voltage as a source voltage for a vertical output signal during a fly-back time, comprising:

a vertical output circuit which amplifies an input sawtooth wave signal and supplies a deflection current to a vertical deflection coil, a power source which applies a standard source voltage to the vertical output circuit; and a charging pump circuit which raises the standard source voltage to obtain a raised source voltage, the charging pump circuit including a first pump-up circuit for raising the standard source voltage from a power source, and a second pump-up circuit which further raises an output voltage from the first pump-up circuit to obtain the raised source voltage, wherein the vertical output circuit operates at the standard source voltage during a scanning interval of the vertical output signal and at the raised source voltage during the fly-back time of the vertical output signal.

2. The vertical deflecting circuit according to claim 1, wherein said second pump-up circuit contains a capacitor, and its charged voltage is added to the output voltage of the first pump-up circuit.

3. The vertical deflecting circuit according to claim 2, wherein the charged voltage in the capacitor of said second pump-up circuit can be varied.

4. A vertical deflecting circuit which uses a raised source voltage obtained by raising a standard source voltage as a source voltage for a vertical output signal during a fly-back time, comprising:

a vertical output circuit which amplifies an input sawtooth wave signal and supplies a deflection current to a vertical deflection coil;

a power source which applies a standard source voltage to the vertical output circuit; and a charging pump circuit which raises the standard source voltage to obtain a raised source voltage, the charging pump circuit including a capacitor which has an electrode connected to the power source via rectifying means and another electrode connected to either of a standard electrical potential or the power source via a switch, and a control circuit which controls said switch to connect the latter electrode to the standard electrical potential to charge the capacitor and to connect the latter electrode to the power source to obtain the raised source voltage at the former electrode of the capacitor, wherein the vertical output circuit is operated at the standard source voltage during a scanning interval of the vertical output signal and at the raised source voltage during the fly-back time of the vertical output signal.

5. A vertical deflecting circuit which uses a raised source voltage obtained by raising a standard source voltage as a source voltage for a vertical output signal during a fly-back time, comprising:

a vertical output circuit which amplifies an input sawtooth wave signal and supplies a deflection current to a vertical deflection coil;

a power source which applies a standard source voltage to the vertical output circuit; and a charging pump circuit which raises the standard source voltage to obtain a raised source voltage, the charging pump circuit including a first capacitor which has an electrode connected to the power source via first rectifying means and another electrode connected to either of a standard electrical potential or the power source via a first switch, a second capacitor which has an electrode connected to the former electrode of said first capacitor via second rectifying means and another electrode connected to either of a standard electrical potential or the former electrode of said first capacitor via a second switch, and a control circuit which controls said first and second switches to connect the latter electrodes of said first and second capacitors to the standard electrical potential to charge the first and second capacitors, to connect the latter electrode of the first capacitor to the power source, and to connect the latter electrode of said second capacitor to the former electrode of said first capacitor to obtain said raised source voltage at the former electrode of said second capacitor, wherein the vertical output circuit is operated at the standard source voltage during a scanning interval of the vertical output signal and at the raised source voltage during the fly-back time of the vertical output signal.

6. The vertical deflecting circuit according to claim 5, wherein said control circuit operates to simultaneously flip said first and second switches to simultaneously charge and discharge said first and second capacitors.

7. The vertical deflecting circuit according to claim 5, wherein a variable power source is provided between said second switch and the standard electrical potential, and the electrical potential of the latter electrode of said second capacitor during charging of said second capacitor is varied by the variable power source to vary the raised source voltage obtained at the former electrode of said second capacitor.

8. A charging pump circuit which raises a standard source voltage from a power source to obtain a raised source voltage, comprising:

a first capacitor which has an electrode connected to the power source via first rectifying means and another electrode connected to either of a standard electrical potential or the power source via a first switch, a second capacitor which has an electrode connected to the former electrode of said first capacitor via second rectifying means and another electrode connected to either of a standard electrical potential or the former electrode of said first capacitor via a second switch, and a control circuit which controls said first and second switches to connect the latter electrodes of said first and second capacitors to the standard electrical potential to charge the first and second capacitors, to simultaneously switch the first and second switches to connect the latter electrode of the first capacitor to the power source, and to connect the latter electrode of said second capacitor to the former electrode of said first capacitor to obtain said raised source voltage at the former electrode of said second capacitor.

* * * * *